United States Patent [19]
Halamik et al.

[11] Patent Number: 5,973,528
[45] Date of Patent: Oct. 26, 1999

[54] CONTROL CIRCUIT AND METHOD FOR A TEMPERATURE SENSITIVE DEVICE

[75] Inventors: Josef Halamik, Roznov, Czech Rep.; Jefferson Hall, Phoenix, Ariz.

[73] Assignee: Motorola, Inc., Schaumburg, Ill.

[21] Appl. No.: 09/061,299

[22] Filed: Apr. 16, 1998

[51] Int. Cl.$^6$ .............................. H03K 3/02; H01L 35/00
[52] U.S. Cl. ......................... 327/198; 327/143; 327/538; 327/512
[58] Field of Search .................................. 327/538–546, 327/512, 513, 143, 198

[56] References Cited

U.S. PATENT DOCUMENTS 4,378,580  3/1983  Stich ........................................ 361/91

FOREIGN PATENT DOCUMENTS 0393280  10/1990  European Pat. Off. ....... H02M 3/335
02224521  9/1990  Japan .............................. H03K 17/08

OTHER PUBLICATIONS

"MC33364, Product preview critical conduction SMPS controller", Motorola Semiconductor technical data, Rev Aug. 21, 1996 one page and MC33364—Rev. Jun. 24, 1996 with 4 pages.

"MC33368, Advance Information Power Factor Controller", Motorola Semiconductor Technical data, Sep. 26, 1995, MC33368 Rev 2, pp. 1–12.

Primary Examiner—Toan Tran
Attorney, Agent, or Firm—Robert M. Handy; Rennie W. Dover

[57] ABSTRACT

An embodiment of the present invention is a switching power supply that includes a power switching device and a control circuit to control the power switching device. Under normal operational conditions the power required by the power switching device is provided by an auxiliary secondary winding of the transformer of the power supply. When the temperature sensitive device gets into an unallowed operational condition this is no longer possible and as a consequence the device is disabled for a period of time which is determined by the amount of overheating of the device.

6 Claims, 3 Drawing Sheets

5,973,528

CONTROL CIRCUIT AND METHOD FOR A TEMPERATURE SENSITIVE DEVICE

FIELD OF THE INVENTION

The present invention relates generally to the field of controlling temperature sensitive devices, and more particularly to switched mode power supply chips.

BACKGROUND OF THE INVENTION

Temperature sensitive devices can be found in virtually any field of technology. Typically a temperature sensitive device is designed to operate within a certain pre-defined temperature range. As long as the operational temperature remains within this pre-defined temperature window the device is in an allowed operational state. If for some reason the device is overdissipated, the operational temperature of the device can increase to a level above the allowed maximum temperature so that the performance of the device is degraded and/or the device is damaged. To prevent such a temperature sensitive device from entering into an unallowed operational temperature state a large number of circuits and methods have been devised in the prior art.

One prior art approach is to sense the operational temperature of the device and compare it to a pre-defined maximum temperature. If the operational temperature of the device surpasses the pre-defined maximum temperature, the power supply of the device is interrupted in order to stop the device from operating. After a pre-defined amount of time the device is reconnected to the power in order to restart operating the device after the cooling period.

This approach has the disadvantage that it is not adaptive to the particular circumstances of the overheating. For example the overheating of the device can be due to an external short circuit. If the short circuit is not removed consecutive attempts will be made to reconnect the device to the power supply whereby each time the amount of energy which can safely be dissipated by the device decreases. This can lead to destruction of the device. Also if the overheating is only of a transient character—for example due to a transient overload—the amount of time required for cooling down the device can be smaller than in other circumstances.

This phenomenon is particularly relevant to power switches. Switched mode power supplies usually use a high-voltage, high-current MOSFET to switch current on and off in the primary winding of an output transformer. Typically the MOSFET is controlled by a pulse width modulation circuit. In case of a short circuit or overload on the secondary side of the transformer such a power supply requires some protection against over heating due to excessive currents. Known devices for application in such an environment include the controllers MC33364 and MC33368 which are commercially available from MOTOROLA, INC. These controllers feature some kind of over temperature protection and shut down capability.

SUMMARY OF THE INVENTION

The underlying problem of the invention is to provide an improved control circuit and method for a temperature sensitive device, such as a switched mode power supply.

The problem of the invention is solved by applying the features laid down in the independent claims. Preferred embodiments are set out in the dependent claims.

The present invention is particular advantageous in that it prevents functional degradation of a temperature sensitive device when an unallowed operational condition is reached. This is done in an effective way by controlling the enabling the device by sensing the temperature of the device.

The temperature dependent voltage reference serves to control the duty cycle for attempts to start-up the device again after a prior disabling operation. This removes the necessity for an external restart control pin and thus—in the case of an integrated device—allows to substantially reduce the amount of silicon area required to implement the device. Further the start-up management robustness is increased and the actual temperature of the device is taken into consideration for the start-up management which increases power over dissipation protection.

DETAILED DESCRIPTION OF A PREFERRED EMBODIMENT

Figure 1:
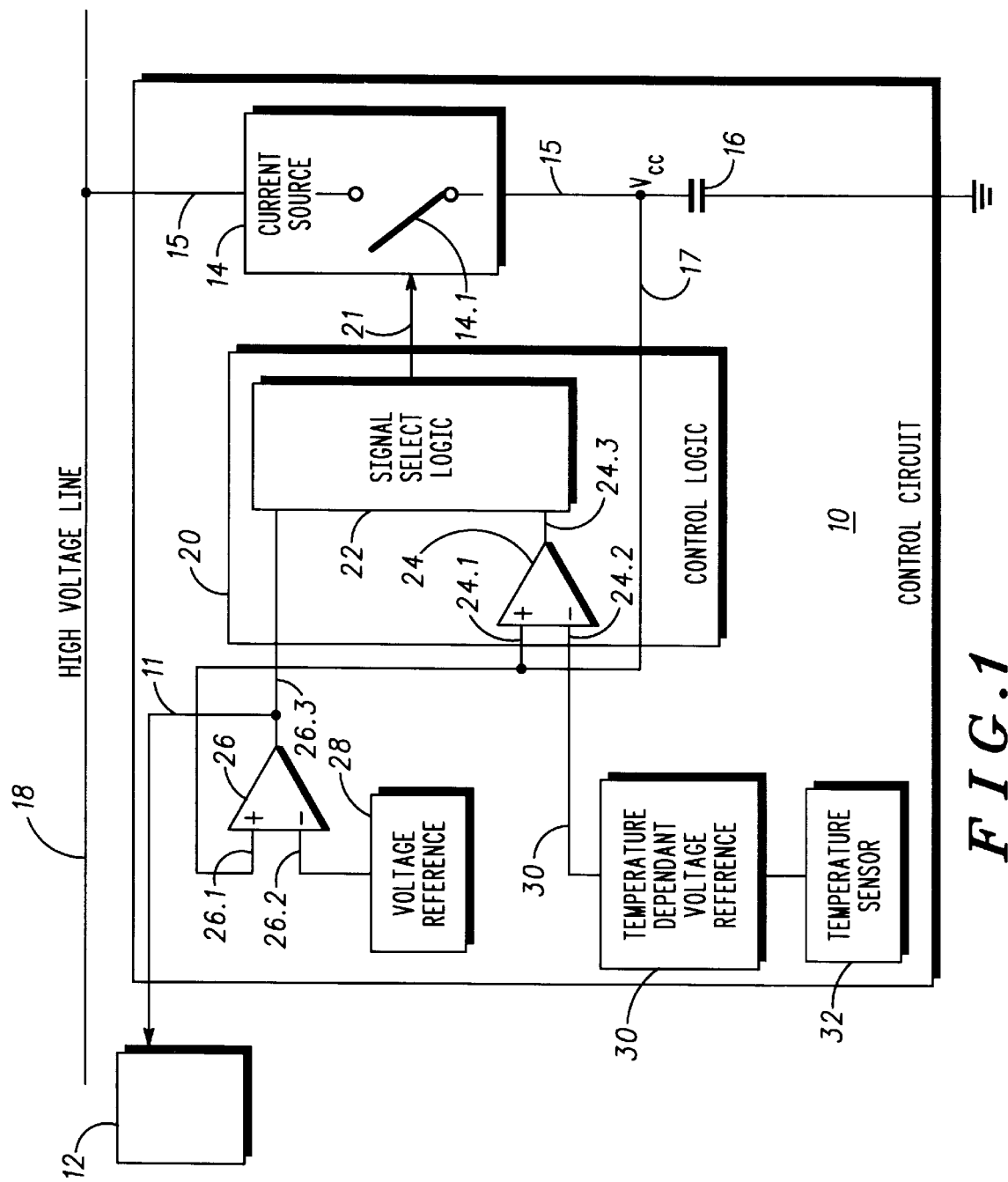
FIG. 1 is a schematic block diagram of a first embodiment of the invention.

FIG. 1 shows a control circuit 10 for a temperature sensitive device 12. The control circuit 10 and the temperature sensitive device 12 are coupled by control line 11. The control circuit 10 comprises a current source 14 which is coupled by line 15 to high voltage line 18. Further the current source 14 is also coupled to capacitor 16 of the control circuit 10. The other terminal of capacitor 16 is connected to ground GND.

Further the control circuit 10 comprises control logic 20. The control logic 20 has a signal select logic 22 which is coupled via line 21 to the current source 14. Further the control logic 20 comprises a comparator 24 which has an input 24.1 and an inverting input 24.2. Output 24.3 of the comparator 24 is coupled to the signal select logic 22.

The control circuit 10 further comprises comparator 26 which has input 26.1 and inverting input 26.2. Output 26.3 of the comparator 26 is coupled to the signal select logic 22 and also to the control line 11. The inverting input 26.2 of the comparator 26 is coupled to a voltage reference 28 whereas the input 26.1 is coupled to the potential Vcc of the capacitor 16 via line 17.

The input 24.1 of comparator 24 is also coupled to the potential Vcc of the capacitor 16 via line 17. The inverting input 24.2 of the comparator 24 is coupled to temperature dependent voltage reference 30. The temperature dependent voltage reference 30 is coupled to temperature sensor 32 which senses a temperature of the device 12.

For operation of the control circuit 10 as well as for operation of the device 12 a certain minimum potential Vcc is required. The required minimum value of Vcc is determined by the voltage delivered by voltage reference 28:

When the high voltage on line 18 is switched on, this causes the current source 14 to operate. Current source 14 comprises a switch 14.1 which is normally closed. The current which is generated by the current source 14 flows through the line 15 to charge the capacitor 16. This results in a continuous increase of the potential Vcc. Once the potential Vcc surpasses the voltage of voltage reference 28 this causes the comparator 26 to switch and deliver a corresponding output signal at its output 26.3. This output signal is transmitted via control line 11 to the device 12. Thereby operation of the device 12 is enabled.

At the same time the output signal of comparator 26 is also transmitted to the signal select logic 22. The signal select logic 22 selects the output signal of comparator 26 as a valid input signal and issues a control signal via line 21 to open the switch 14.1. As a consequence the current which flows through line 15 is interrupted.

Once the control circuit 10 and the device 12 have started operation there is no more need to charge the capacitor 16 by means of the current source 14 from the high voltage line 18. The reason is that the device 12 itself is capable of maintaining the required potential Vcc at the capacitor 16 due to an additional power supply which is not shown in the drawing. Typically the power supply of device 12 is also coupled to the high voltage line 18.

Under normal allowed operational conditions of device 12 the potential Vcc is always maintained by the device 12 at a sufficiently high level so that no switching operations by comparator 26 happen in the steady state. Since signal select logic 22 always selects the output signal issued by comparator 26 as a valid input signal when the high voltage is switched on, the output of comparator 24 is ignored by the signal select logic 22 in the steady state during an allowed operational condition of device 12.

If there is a short circuit in device 12 or a load is placed on the device 12 which it can not support, this will burden the power supply of the device 12 so much that the potential Vcc can not be maintained at a sufficiently high level. In such an operational condition also the temperature of the device 12 will increase due to increased power dissipation.

The drop of the potential Vcc below the threshold defined by the voltage reference 28 causes the comparator 26 to change its state again and to change its output signal correspondingly. Since the output signal of comparator 26 at its output 26.3 changes from the "enable" to the "disable" state, the operation of device 12 is disabled by the signal transmitted via control line 11. The disabling of operation of the device 12 results in a substantially lower power dissipation or in no power dissipation at all if the device 12 is completely cut from the power supply in response to the disabling signal received via control line 11. As a consequence the device 12 starts to cool down after disabling.

The signal select logic 22 also receives the disabling signal from the comparator 26. The reception of the disabling signal causes signal select logic 22 to deselect the output of comparator 26 as a valid input and to select the output of comparator 24 as a valid input. Thus the output signal of the comparator 26 is disregarded by the signal select logic 22 after the disabling of the device 12 whereas the output signal of comparator 24 is selected as a valid input signal.

The temperature signal which is delivered by the temperature sensor 32 determines the voltage level of the temperature dependent voltage reference 30. The temperature sensor can incorporate a resistor, a diode or any other electronic circuit component delivering a temperature dependent signal. The temperature dependent voltage reference 30 has a negative temperature coefficient which means that the output voltage of the voltage reference 30 gets lower if the temperature which is sensed by sensor 32 is increased and that the output voltage gets higher if the temperature sensed by sensor 32 decreases. For example, to implement such a temperature sensor a current source can be coupled to a resistor having a negative temperature coefficient. The voltage drop over the resistor can serve as a temperature dependent voltage reference.

In the steady state condition the output voltage of voltage reference 30 is lower than the voltage potential Vcc. After the disabling of the device 12 the potential Vcc starts to drop due to the discharging of the capacitor 16. As long as the potential Vcc is above the output of voltage reference 30 which is present at the input 24.2 the comparator 24 does not change its state so that the signal which is present at the output 24.3 also remains unchanged. As long as this is the case the signal select logic 22 does not close the switch 14.1 via line 21.

After a certain time period the potential Vcc has dropped below the output voltage of voltage reference 30. The length of this time period is temperature dependent because the output voltage of voltage reference 30 depends on the signal delivered by the sensor 32. Because of the negative temperature coefficient of the output voltage characteristic of the voltage reference 30, the length of the time period required for the potential Vcc to drop below the output voltage of voltage reference 30 is the longer, the higher the temperature which is sensed on the device 12 by the temperature sensor 32.

The drop of the potential Vcc below the output voltage of voltage reference 30 results in that comparator 24 changes its state. This means that the comparator 24 issues an output signal at its output 24.3 which is received by the signal select logic 22. This input signal from the comparator 24 is not ignored by the signal select logic 22 since the output 24.3 of the comparator 24 has been selected as a valid input signal by the signal select logic 22. The signal issued by comparator 24 in response to the dropping of the potential Vcc causes the signal select logic 22 to close the switch 14.1 of the current source 14 by issuing a corresponding signal on the line 21. When the switch 14.1 is closed again the signal select logic deselects the output 24.3 of the comparator 24 and selects the output 26.3 of the comparator 26 as a valid input.

Once the switch 14.1 is closed the current source 14 provides a current to capacitor 16 which recharges the capacitor 16 and thus increases its potential Vcc. When the potential Vcc has increased to a level above the voltage delivered by voltage reference 28 this again causes the comparator 26 to change its state and to issue a corresponding output signal at its output 26.3. The following process is similar to the initial start-up operation when the high voltage is connected to line 18.

The output signal of comparator 26 which is delivered at its output 26.3 has been selected by the signal select logic as a valid input signal. Hence the reception of this signal causes the signal select logic to issue an output signal via line 21 to reopen the switch 14.1 again. At the same time the output 26.3 is deselected by the signal select logic 22 and the output 24.3 is selected.

Like in the initial start-up phase the output signal of comparator 26 is also transmitted via the control line 11 to the device 12 in order to re-enable the device 12. Therefore the current delivered by current source 14 is no longer needed since—like explained with reference to the initial start-up phase the enabling of the device 12 also results in the enabling of a separate power supply which makes the current source 14 redundant.

If the unallowed operational condition of the device 12 disappeared—for example the over load is no longer present or the short circuit has been removed—the device 12 can continue to operate in a steady state. However, if the unallowed operational condition occurs again after the re-enabling of the device 12 or is still present, this will again result in a drop of the potential Vcc and thus in a disabling of the device 12 by a corresponding output signal of comparator 26. This output signal is ignored by the signal select logic 22 since the output 26.3 is deselected. Signal select logic 22 waits until an output signal is received from comparator 24 to indicate that the potential Vcc has dropped sufficiently low—below the voltage output of voltage reference 30—so that the current source 14 can be switched on again.

As long as the short circuit or the overload is not removed from the device 12 each enabling of the device 12 by comparator 26 will result in an immediate consecutive disabling since the voltage potential Vcc can not be maintained at a sufficiently high level. Such a sequence of enabling/disabling operations is adaptively controlled by the control circuit 10 based on the signal delivered by temperature sensor 32.

Since the time delay between two consecutive attempts is prolonged if the temperature of the device 12 is relatively high, more time for cooling is available for device 12 until a next attempt is made to enable the device 12. This is crucial in order not to over heat the device 12 by too frequent attempts to enable it. Also this provides protection for the control circuit 10 itself since each charging of the capacitor 16 by the current source 14 which is connected to the high voltage line 18 results in a considerable power dissipation.

Figure 2:
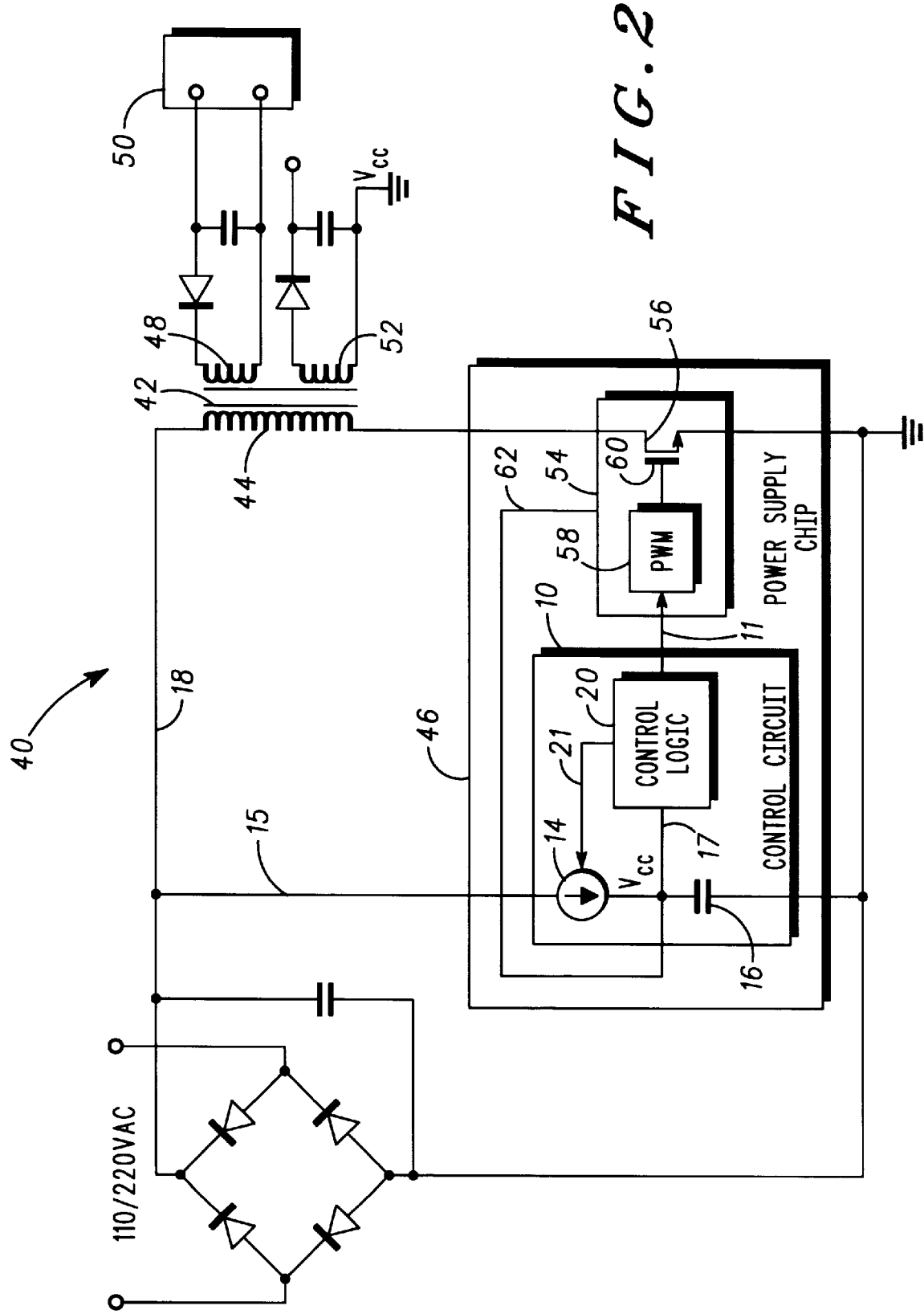
FIG. 2 is a schematic block diagram of a second embodiment of the invention.

With reference to FIG. 2 now one application example of the control circuit 10 of FIG. 1 is explained in more detail. In the example considered here the control circuit 10 is incorporated in a power supply 40. The power supply 40 includes an output transformer 42 with a primary winding 44 and a switched mode power supply chip 46. The output transformer 42 has a secondary winding 48 to deliver the output DC power at its terminal 50. Further the output transformer 42 has an auxiliary secondary winding 52 to provide the potential Vcc which is used as a power supply for the power supply chip 46 in the steady state.

The power supply chip 46 has a power switching device 54 for switching the winding current of primary winding 44 on and off. The power switching device 54 comprises a power transistor 56 to switch the winding current. The switching operation of the power transistor 56 is controlled by a pulse width modulation unit 58 which is connected to a gate 60 of the power transistor 56.

Further the power supply chip 46 comprises the control circuit 10 like shown in FIG. 1. For simplicity not all elements of control circuit 10 are shown in FIG. 2.

The power switching device 54 is a temperature sensitive device of the type of the temperature sensitive device 12 shown in FIG. 1. The control circuit 10 is coupled via the control line 11 to the power switching device 54 to control the operation of the power switching device 54. Further, the power switching device 54 is connected by the line 62 to one terminal of the capacitor 16 which has the potential Vcc (cf. FIG. 1). Like it is explained with reference to FIG. 1 the capacitor 16 is coupled via the line 15 and current source 14 to the high voltage line 18. In the example considered here with reference to FIG. 2 the high voltage line 18 forms part of the power supply 40 and carries the primary winding current.

To perform switching operations the power switching device 54 needs a certain amount of input power. Thus, when the power supply 40 is first connected to the high voltage (110–220 VAC) no switching operation of the power switching device 54 initially occurs so that no current is induced in the auxiliary secondary winding 52. Hence no voltage is initially delivered by the auxiliary secondary winding 52 which could be used to power the power switching device 54.

However the capacitor 16 is charged by current source 14 until a sufficiently high potential Vcc is reached which causes the control circuit 10 to issue an enable signal via the control line 11 to the power switching device 54. Since the power switching device 54 is also connected to the potential Vcc delivered by the capacitor 16, the required input power for the power switching device 54 is initially provided via the line 62 from the capacitor 16.

Immediately after the power switching device 54 is enabled by the control circuit 10 the switching of the power transistor 56 starts so that a voltage is induced into the auxiliary secondary winding 52 which provides now for the required potential Vcc. As a consequence the input power for the power switching device 54 is taken from the auxiliary winding 52 instead of the capacitor 16. Hence the current source 14 is no longer needed. In fact, the current source 14 is switched off by the control logic 20 after the power switching device 54 has been enabled—the same way as explained in more detail with reference to FIG. 1.

When the power supply 40 is overloaded or if there is a short circuit or another kind of unallowed operational condition this leads to an increase of the temperature of the power switching device 54 due to the increased current and resulting increased power dissipation. The temperature of power switching device 54 is measured by the temperature sensor 32 which is not shown in FIG. 2.

The unallowed operational condition of the power switching device 54 results in that the potential Vcc can not be maintained at a sufficiently high level by the auxiliary winding 52. This causes the control circuit 10 to disable the power switching device 54 by issuing a corresponding control signal via the control line 11. The disabling of the power switching device 54 results in that no power is available on the secondary side of the output transformer 42. Hence the charge of the capacitor 16 starts to decrease due to leakage and other discharging currents.

When the potential Vcc of the capacitor 16 has dropped below a level as determined by the temperature of the power switching device 54, the control circuit 10 enables the power switching device 54 again. The time period which lapses between the disabling and the enabling of the power switching device 54 is dependent on the temperature of the power switching device 54. Thus, over heating is prevented which otherwise could have resulted in functional degradation or destruction of the power switching device 54 and/or the control circuit 10.

Figure 3:
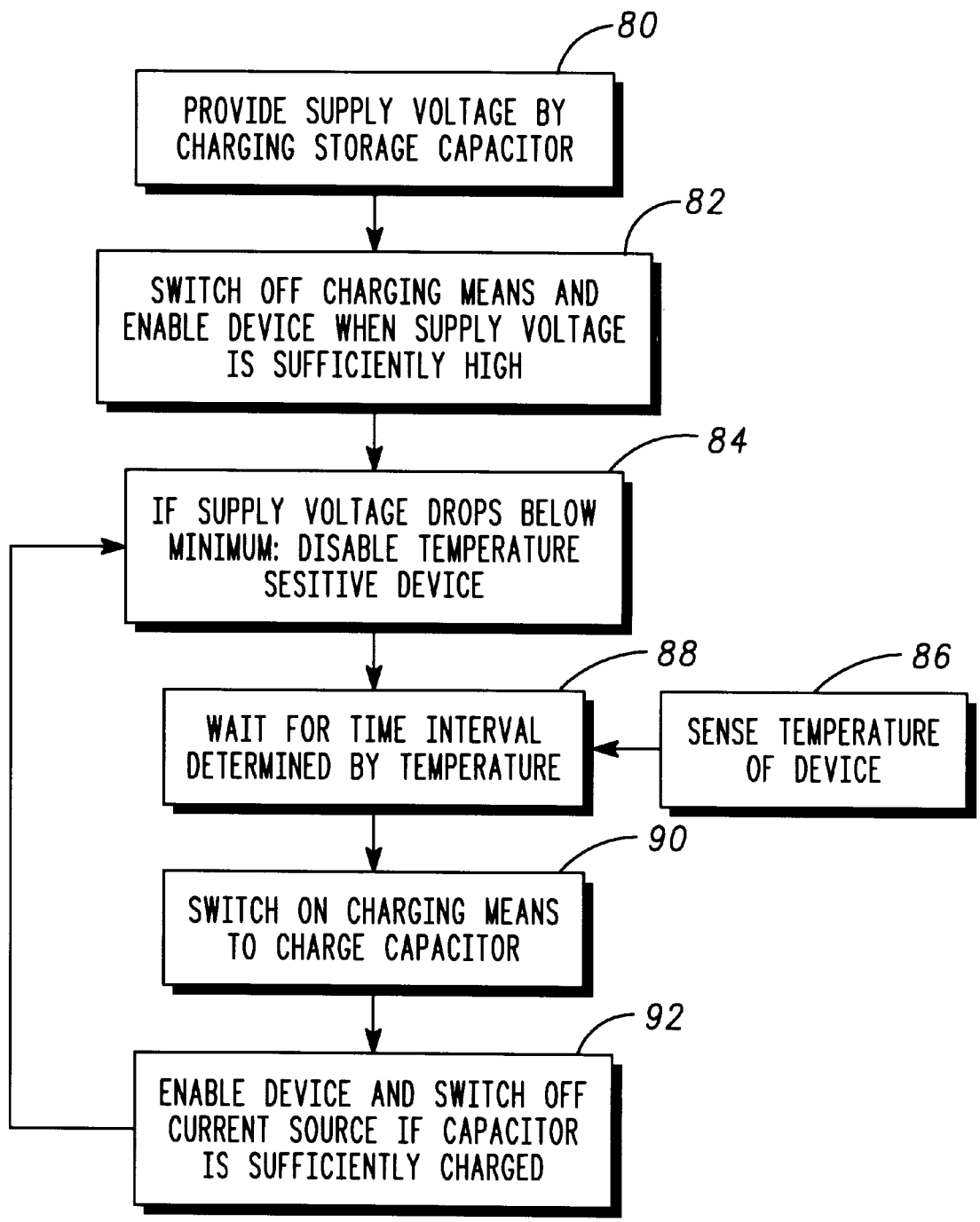
FIG. 3 is a preferred embodiment of the method of the invention.

In the following one embodiment of the method of the invention is explained with reference to FIG. 3. In order to operate a temperature sensitive device—of the type of device 12 or 54 for example—a storage capacitor is initially charged in step 80. The storage capacitor can be of the type of capacitor 16 as explained with reference to FIG. 1 and FIG. 2. Typically the storage capacitor is charged by means of a current source.

When the voltage of the capacitor has reached a sufficient level this allows the temperature sensitive device to start operation and to provide for its own power supply. The current source is switched off in step 82.

The voltage of the storage capacitor is monitored in step 84. If the voltage drops below a certain minimum this indicates an unallowed condition of the temperature sensitive device. In response to this the device is disabled. In step 86 the temperature of the device is sensed. Based on the temperature of the device a time interval is determined to cool down the over heated device.

In step 88 this time interval lapses until the current source is switched on again to recharge the capacitor in step 90. The recharging of the capacitor in step 90 serves to initiate the re-enabling of the device once the capacitor is sufficiently charged. The device is re-enabled in step 92. Then the control returns back to step 84 in order to continue to monitor the supply voltage. If the device is still in an unallowed operational condition, this will result in an increase of its temperature so that the same sequence of steps 86–92 will be carried out repeatedly until the cause for the unallowed operational condition is removed.

We claim:

1. A control circuit for a temperature sensitive device, said control circuit being adapted to disable an operation of said device if a supply voltage for said device drops beyond a reference voltage, said control circuit comprising:

a switchable current source;

a capacitor connected to said current source, said capacitor buffering said supply voltage;

a control logic being adapted to switch said current source;

a temperature dependent voltage reference which delivers a voltage reference being dependent on a temperature of said device, said voltage reference having a negative temperature coefficient;

said control logic being adapted to compare said supply voltage to said temperature dependent voltage reference and if said supply voltage has dropped below said temperature dependent voltage reference to switch on said current source.

2. The control circuit according to claim 1, said control circuit comprising a comparator having its first input coupled to said reference voltage and having its second input coupled to said supply voltage, an output of said comparator issuing a disable signal for said device if said supply voltage for said device drops beyond said reference voltage.

3. The control circuit according to claim 1, said temperature sensitive device being a switched mode power supply chip for a power supply, said current source being adapted to be connected to a high voltage line.

4. A switched mode power supply chip, comprising:

power switching means for switching a primary winding current of a switched mode power supply transformer on and off, a control circuit for said power switching means, said control circuit being adapted to disable an operation of said power switching means if a supply voltage for said power switching means drops beyond a reference voltage, said control circuit comprising:

a switchable current source;

a capacitor connected to said current source, said capacitor buffering said supply voltage;

a control logic being adapted to switch said current source;

a temperature dependent voltage reference which delivers a voltage reference being dependent on a temperature of said power switching means, said voltage reference having a negative temperature coefficient;

said control logic being adapted to compare said supply voltage to said temperature dependent voltage reference and if said supply voltage has dropped below said temperature dependent voltage reference to switch on said current source.

5. A power supply comprising a transformer and a switched mode power supply chip, said switched mode power supply chip comprising:

power switching means for switching a primary winding current of a switched mode power supply transformer on and off, a control circuit for said power switching means, said control circuit being adapted to disable an operation of said power switching means if a supply voltage for said power switching means drops beyond a reference voltage, said control circuit comprising:

a switchable current source;

a capacitor connected to said current source, said capacitor buffering said supply voltage;

a control logic being adapted to switch said current source;

a temperature dependent voltage reference which delivers a voltage reference being dependent on a temperature of said power switching means, said voltage reference having a negative temperature coefficient;

said control logic being adapted to compare said supply voltage to said temperature dependent voltage reference and if said supply voltage has dropped below said temperature dependent voltage reference to switch on said current source.

6. A method for controlling a temperature sensitive device, said method comprising the steps of providing a supply voltage for said device by charging a buffer capacitor;

disabling an operation of said device if said supply voltage for said device drops beyond a reference voltage;

sensing a temperature of said device;

waiting for a time interval determined by said temperature, said time interval being the longer the higher said temperature is; and recharging said buffer capacitor to enable said operation of said device again.

* * * * *